(12) United States Patent
Takahashi

(10) Patent No.: US 10,854,463 B2
(45) Date of Patent: Dec. 1, 2020

(54) ETCHING METHOD AND METHOD FOR MANUFACTURING DRAM CAPACITOR

(71) Applicant: TOKYO ELECTRON LIMITED, Tokyo (JP)

(72) Inventor: Nobuhiro Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/327,039

(22) PCT Filed: Jul. 10, 2017

(86) PCT No.: PCT/JP2017/025097
§ 371 (c)(1),
(2) Date: Feb. 21, 2019

(87) PCT Pub. No.: WO2018/037739
PCT Pub. Date: Mar. 1, 2018

(65) Prior Publication Data
US 2019/0206694 A1 Jul. 4, 2019

(30) Foreign Application Priority Data
Aug. 22, 2016 (JP) ................. 2016-161936

(51) Int. Cl.
| | |
|---|---|
| H01L 21/3065 | (2006.01) |
| H01L 21/3213 | (2006.01) |
| H01L 49/02 | (2006.01) |
| H01L 27/108 | (2006.01) |
| H01L 21/311 | (2006.01) |
| H01J 37/32 | (2006.01) |
| H01L 21/67 | (2006.01) |

(52) U.S. Cl.
CPC .... *H01L 21/3065* (2013.01); *H01J 37/32449* (2013.01); *H01L 21/31116* (2013.01); *H01L 21/32135* (2013.01); *H01L 21/32137* (2013.01); *H01L 21/67069* (2013.01); *H01L 27/1085* (2013.01); *H01L 28/60* (2013.01); *H01L 28/91* (2013.01); *H01J 2237/334* (2013.01)

(58) Field of Classification Search
None
See application file for complete search history.

(56) References Cited

U.S. PATENT DOCUMENTS

2016/0064519 A1* 3/2016 Yang ................. H01L 21/02068
438/712

FOREIGN PATENT DOCUMENTS

| | | |
|---|---|---|
| JP | 6283476 A | 10/1994 |
| JP | 2002524851 A | 8/2002 |
| JP | 2013110139 A | 6/2013 |
| JP | 2014236055 A | 12/2014 |
| JP | 2016143781 A | 8/2016 |
| WO | 2016056300 A1 | 4/2016 |

* cited by examiner

*Primary Examiner* — Jiong-Ping Lu
(74) *Attorney, Agent, or Firm* — Nath, Goldberg & Meyer; Jerald L. Meyer

(57) ABSTRACT

There is provided an etching method which includes: preparing a target substrate having a silicon portion, a silicon nitride film and a silicon oxide film; and selectively etching the silicon portion with respect to the silicon nitride film and the silicon oxide film by supplying a fluorine-containing gas and an inert gas which stay in an excited state to the target substrate.

15 Claims, 5 Drawing Sheets

ETCHING METHOD AND METHOD FOR MANUFACTURING DRAM CAPACITOR

TECHNICAL FIELD

The present disclosure relates to an etching method for etching a silicon portion existing on a substrate and a method for manufacturing a DRAM capacitor.

BACKGROUND

In a manufacturing process of a semiconductor device, there is a process of etching and removing a silicon portion, for example, a polysilicon film existing on a substrate. Wet etching may be used to etch such a silicon portion. However, in cases where a fine pattern remains after etching a silicon portion, patterning may occur during drying performed after wet etching. As such, dry etching may be required instead of wet etching in some cases.

Existing techniques for performing dry etching on an etching target portion such as a polysilicon film or the like include using HF gas+$F_2$ gas, or FNO gas+$F_2$ gas+inert gas (Patent Document 1); or using $F_2$ gas+$NH_3$ gas (Patent Document 2).

PRIOR ART DOCUMENTS

Patent Documents

Patent Document 1: Japanese laid-open publication No. 2014-236055
Patent Document 2: Japanese laid-open publication No. 2016-143781

Incidentally, when etching a silicon portion such as a polysilicon film or the like in a semiconductor wafer (silicon wafer) which is a target substrate, it is not only required that an etching rate is extremely high, but also requires that selectivity be extremely high with respect to a coexisting silicon nitride (SiN) film, a coexisting silicon ($SiO_2$) film or the like. However, in the techniques of Patent Documents 1 and 2, the etching rate and the selectivity may not be compatible at a required level.

In a DRAM capacitor, there may be a case where a titanium-based film such as a titanium nitride (TiN) film or the like as a lower electrode is formed in a cylindrical shape on a sacrificial polysilicon film and then the sacrificial polysilicon film is etched away. In this case, in addition to the requirement for an extremely high etching rate, an extremely high selectivity is required not only for a SiN film or a $SiO_2$ film but also for a titanium-based film.

SUMMARY

The present disclosure provides some embodiments of a technique for etching a silicon portion existing on a substrate at an extremely high etching rate and at an extremely high selectivity with respect to a silicon nitride film and a silicon oxide film.

Furthermore, the present disclosure provides some embodiments of an etching method and a method for manufacturing a DRAM capacitor, which are capable of etching a silicon portion existing on a substrate at a high etching rate and an extremely high selectivity with respect to not only a SiN film or a $SiO_2$ film but also a Ti-based film.

According to a first aspect of the present disclosure, there is provided etching method, including: preparing a target substrate includes a silicon portion, a silicon nitride film and a silicon oxide film; and selectively etching the silicon portion with respect to the silicon nitride film and the silicon oxide film by supplying a fluorine-containing gas and an inert gas maintained in an excited state to the target substrate.

In the first aspect, an etching rate for the silicon portion may be 100 nm/min or greater, and an etching selectivity of the silicon portion to the silicon nitride film and the silicon oxide film is 500 or greater. The fluorine-containing gas may be at least one selected from a group consisting of a hydrogen fluoride gas and a sulfur hexafluoride gas.

In the first aspect, the target substrate further includes a Ti-based film. The method may include selectively etching the silicon portion with respect to the Ti-based film. In this case, the fluorine-containing gas may be a hydrogen fluoride gas.

The inert gas may be at least one selected from a group consisting of an $N_2$ gas and an Ar gas. A volume ratio of the fluorine-containing gas and the inert gas may be in a range of 10:1 to 1:10. A temperature of the target substrate at the time of etching may be in a range of 20 to 60 degrees C. A pressure at the time of etching may be in a range of 66.5 to 266 Pa.

According to a second aspect of the present disclosure, there is provided a method for manufacturing a DRAM capacitor, including: preparing a semiconductor wafer having a structure in which an underlying silicon oxide film is formed on a semiconductor substrate, a sacrificial polysilicon film is formed on the silicon oxide film, a plurality of columnar recesses is formed in the sacrificial polysilicon film, a plurality of cylindrical TiN films serving as lower electrodes are formed in the respective columnar recesses and a silicon nitride film for supporting the cylindrical TiN films is formed on the sacrificial polysilicon film; and selectively etching the sacrificial polysilicon film by supplying a hydrogen fluoride gas and an inert gas which are maintained in an excited state to the semiconductor wafer so that the plurality of cylindrical TiN films are allowed to remain as the lower electrodes for DRAM capacitors supported by the silicon nitride film.

According to a third aspect of the present disclosure, there is provided a storage medium operating on a computer and storing a program for controlling an etching apparatus, wherein the program, when executed, causes the computer to control the etching apparatus so as to perform the etching method according to the first aspect.

According to the present disclosure, in a substrate including a silicon portion, a silicon nitride film and a silicon oxide film, when selectively etching the silicon portion with respect to the silicon nitride film and the silicon oxide film, a fluorine-containing gas and an inert gas are supplied to the substrate in an excited state, whereby the silicon portion existing on the substrate can be etched at an extremely high etching rate and at an extremely high selectivity with respect to a SiN film and a $SiO_2$ film.

BRIEF DESCRIPTION OF DRAWINGS

FIGS. 4A and 4B are views illustrating a structural example of a device to which the present disclosure is applied, wherein FIG. 4A shows a state before etching and FIG. 4B shows a state after etching.

DETAILED DESCRIPTION

Embodiments of the present disclosure will now be described in detail with reference to the drawings.

<Processing System>

Figure 1:
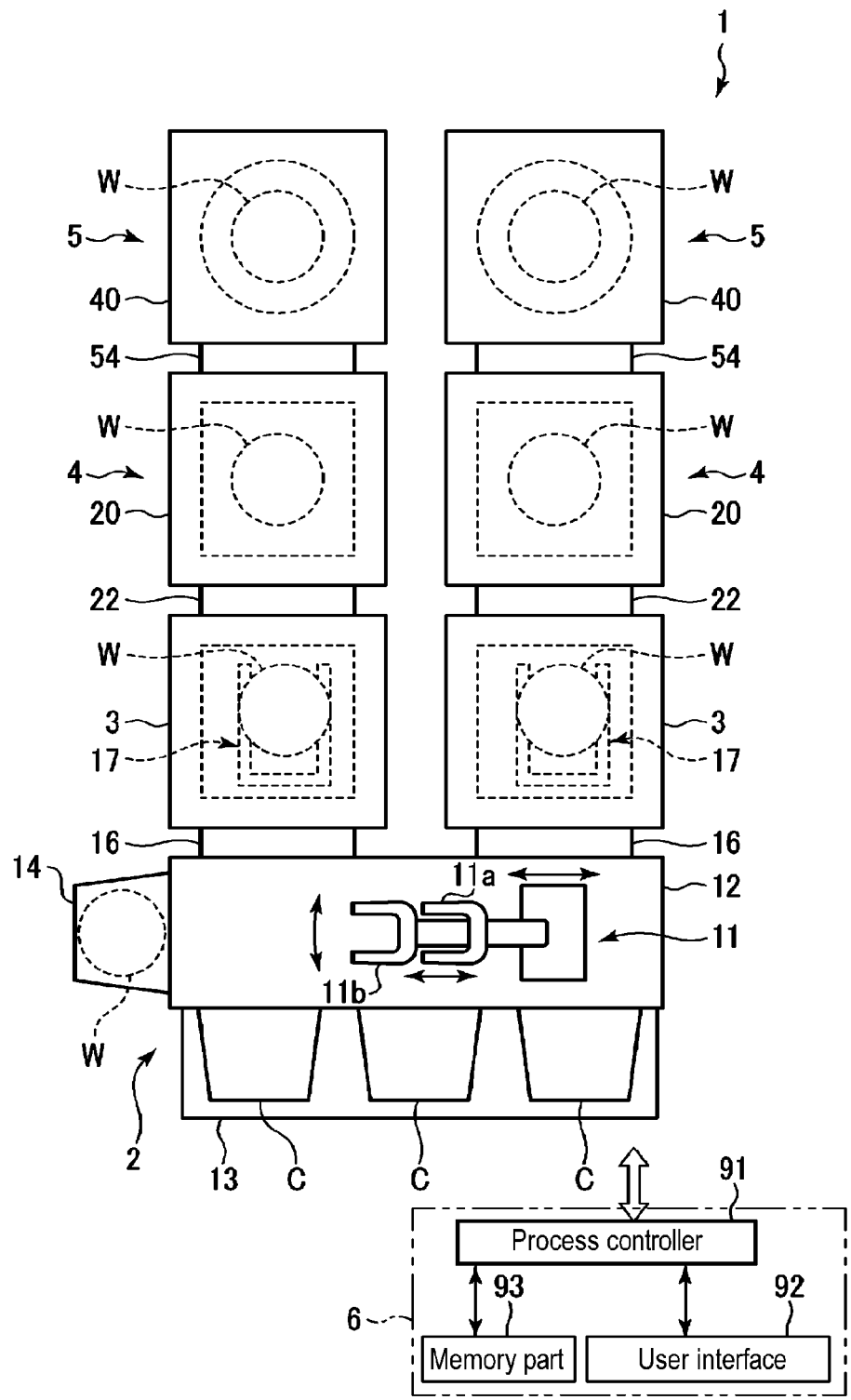
FIG. 1 is a schematic configuration diagram illustrating an example of a processing system equipped with an etching apparatus for performing an etching method according to an embodiment of the present disclosure.

FIG. 1 is a schematic configuration diagram showing an example of a processing system equipped with an etching apparatus for performing an etching method according to an embodiment of the present disclosure. A processing system 1 includes a loading/unloading part 2 through which a semiconductor wafer (hereinafter simply referred to as a wafer) W as a target substrate is transferred, two load lock chambers (L/L) 3 provided adjacent to the loading/unloading part 2, respective heat treatment apparatuses 4 provided adjacent to the load lock chambers 3 and configured to perform a heat treatment on the wafer W, respective etching apparatuses 5 provided adjacent to the heat treatment apparatuses 4 and configured to perform etching on the wafer W, and a control part 6.

The loading/unloading part 2 includes a transfer chamber (L/M) 12 in which a first wafer transfer mechanism 11 for transferring the wafer W is provided. The first wafer transfer mechanism 11 includes two transfer arms 11a and 11b configured to hold the wafer W in a substantially horizontal posture. A carrier mounting table 13 is provided at a one side of the transfer chamber 12 in a longitudinal direction. For example, three carriers C capable of accommodating a plurality of wafers W arranged side by side are configured to be connected to the carrier mounting table 13. An orienter 14 configured to optically measure an eccentricity amount by rotating the wafer W and configured to perform positioning is provided adjacent to the transfer chamber 12.

In the loading/unloading part 2, the wafer W is held by the transfer arm 11a or 11b. With the operation of the first wafer transfer mechanism 11, the wafer W is linearly moved in a substantially horizontal plane and is moved up and down, whereby the wafer W is transferred to a desired position. The wafer W is subsequently loaded and unloaded as the transfer arm 11a or 11b moves toward or away from the carrier C mounted on the carrier mounting table 13, the orienter 14 and the load lock chambers 3.

Each of the load lock chambers 3 is connected to the transfer chamber 12 in a state in which a gate valve 16 is interposed between the respective load lock chamber 3 and the transfer chamber 12. A second wafer transfer mechanism 17 for transferring the wafer W is provided in each of the load lock chambers 3. In addition, the load lock chamber 3 is configured to be evacuated to a predetermined level of vacuum.

The second wafer transfer mechanism 17 includes an articulated arm structure and includes a pick configured to hold the wafer W in a substantially horizontal posture. In this second wafer transfer mechanism 17, the pick is positioned inside the load lock chamber 3 with the articulated arm kept in a contracted state. The pick can reach the heat treatment apparatus 4 by extending the articulated arm and can reach the etching apparatus 5 by further extending the articulated arm. The second wafer transfer mechanism 17 can transfer the wafer W between the load lock chamber 3, the heat treatment apparatus 4 and the etching apparatus 5.

Figure 2:
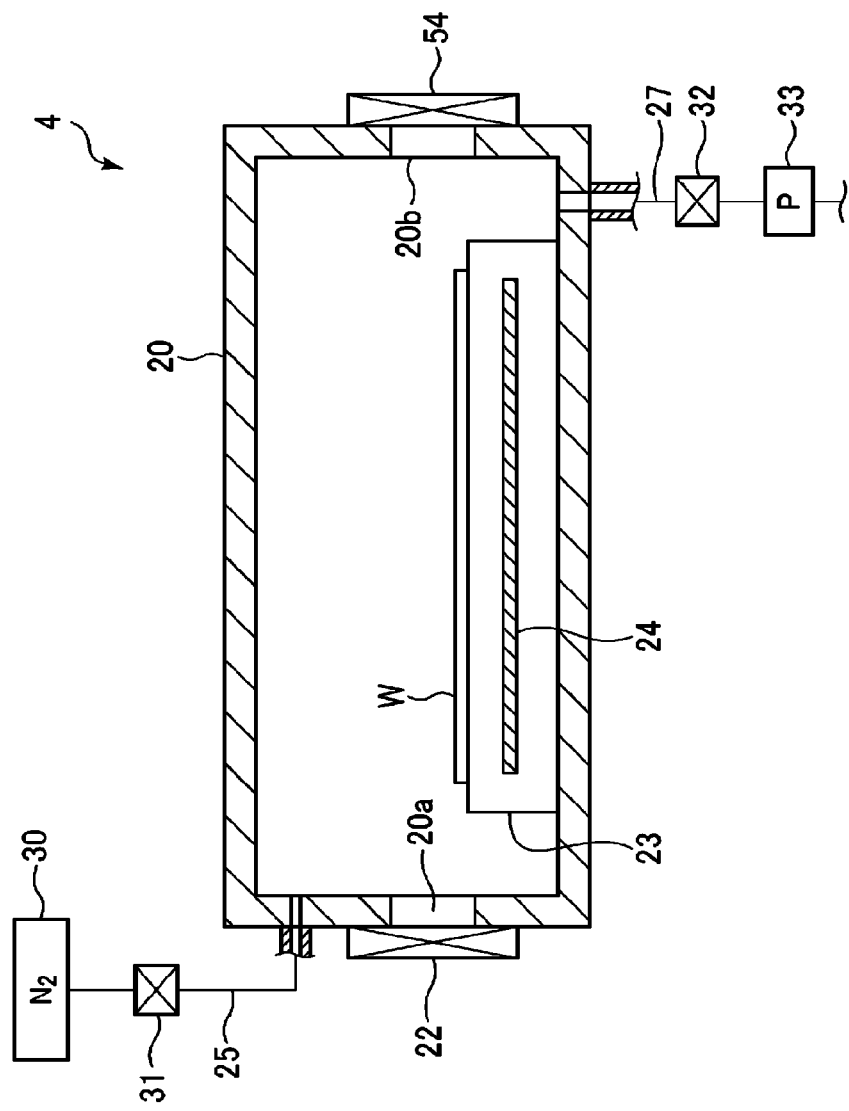
FIG. 2 is a sectional view illustrating a heat treatment apparatus installed in the processing system of FIG. 1.

As shown in FIG. 2, the heat treatment apparatus 4 includes a vacuumable chamber 20 and a mounting table 23 installed inside the chamber 20 and configured to mount the wafer W thereon. A heater 24 is buried in the mounting table 23. The wafer W subjected to an etching process is heated by the heater 24 to vaporize and remove etching residues existing on the wafer W. A loading/unloading port 20a through which the wafer is loaded into or unloaded from the load lock chamber 3 is formed at the side of the load lock chamber 3 in the chamber 20. The loading/unloading port 20a can be opened and closed by a gate valve 22. A loading/unloading port 20b through which the wafer W is loaded into or unloaded from the etching apparatus 5 is formed at the side of the etching apparatus 5 in the chamber 20. The loading/unloading port 20b can be opened and closed by a gate valve 54. A gas supply channel 25 is connected to an upper portion of the sidewall of the chamber 20. The gas supply channel 25 may be connected to an $N_2$ gas supply source 30. An exhaust path 27 is connected to a bottom wall of the chamber 20. The exhaust path 27 is connected to a vacuum pump 33. A flow rate regulation valve 31 is provided in the gas supply channel 25. A pressure regulation valve 32 is provided in the exhaust path 27. By adjusting these valves, the interior of the chamber 20 is maintained in an $N_2$ gas atmosphere having a predetermined pressure to perform a heat treatment. An inert gas other than the $N_2$ gas, for example, an Ar gas, may be used.

The etching apparatus 5 is provided to selectively etch a silicon portion of the wafer W. Specific configurations thereof will be described later in detail.

The control part 6 includes a process controller 91 equipped with a CPU for controlling the respective constituent parts of the processing system 1. A user interface 92 including a keyboard through which an operator inputs commands and the like to manage the processing system 1 and a display for visually displaying an operational status of the processing system 1 is connected to the process controller 91. Furthermore, a memory part 93 for storing a process recipe which is a control program for realizing various processes to be executed in the processing system 1, for example, the supply of a processing gas in the etching apparatus 5 to be described later, the evacuation of the chamber, and the like under the control of the process controller 91, various databases, and so forth are connected to the process controller 91. The recipe is stored in an appropriate storage medium (not shown) in the memory part 93. If necessary, an arbitrary recipe is retrieved from the memory part 93 and is executed by the process controller 91, whereby a desired process in the processing system 1 is performed under the control of the process controller 91.

In the processing system 1, in a state where the gate valve 16 located at the atmospheric side is opened, one sheet of wafer W is transferred from the carrier C of the loading/unloading part 2 into the load lock chamber 3 by one of the transfer arms 11a and 11b of the first wafer transfer mechanism 11, and is delivered to the pick of the second wafer transfer mechanism 17 inside the load lock chamber 3.

Thereafter, the gate valve 16 located at the atmospheric side is closed to evacuate the interior of the load lock chamber 3. Subsequently, the gate valve 54 is opened, and the pick is extended up to the etching apparatus 5 to transfer the wafer W into the etching apparatus 5.

Thereafter, the pick is returned to the load lock chamber 3, the gate valve 54 is closed, and an etching process is performed in the etching apparatus 5 as described later.

Following the etching process, the gate valves 22 and 54 are opened, the wafer W subjected to the etching process is transferred to the heat treatment apparatus 4 by the pick of the second wafer transfer mechanism 17. While introducing an $N_2$ gas into the chamber 20, the wafer W mounted on the mounting table 23 is heated by the heater 24 so that the etching residues and the like are removed by the heating.

Once the heat treatment in the heat treatment apparatus 4 is completed, the gate valve 22 is opened. The wafer W mounted on the mounting table 23, which has been subjected to the heat treatment, is withdrawn and moved to the load lock chamber 3 by the pick of the second wafer transfer mechanism 17, and is returned to the carrier C by one of the transfer arms 11a and 11b of the first wafer transfer mechanism 11. In this way, the processing of one sheet of wafer is completed.

In the processing system 1, the heat treatment is not essential. In this case, the heat treatment apparatus 4 may be omitted. In the case where the heat treatment apparatus 4 is not provided, the wafer W subjected to the etching process may be withdrawn and moved to the load lock chamber 3 by the pick of the second wafer transfer mechanism 17, and may be returned to carrier C by one of the transfer arms 11a and 11b of the first wafer transfer mechanism 11.

<Configuration of Etching Apparatus>

Figure 3:
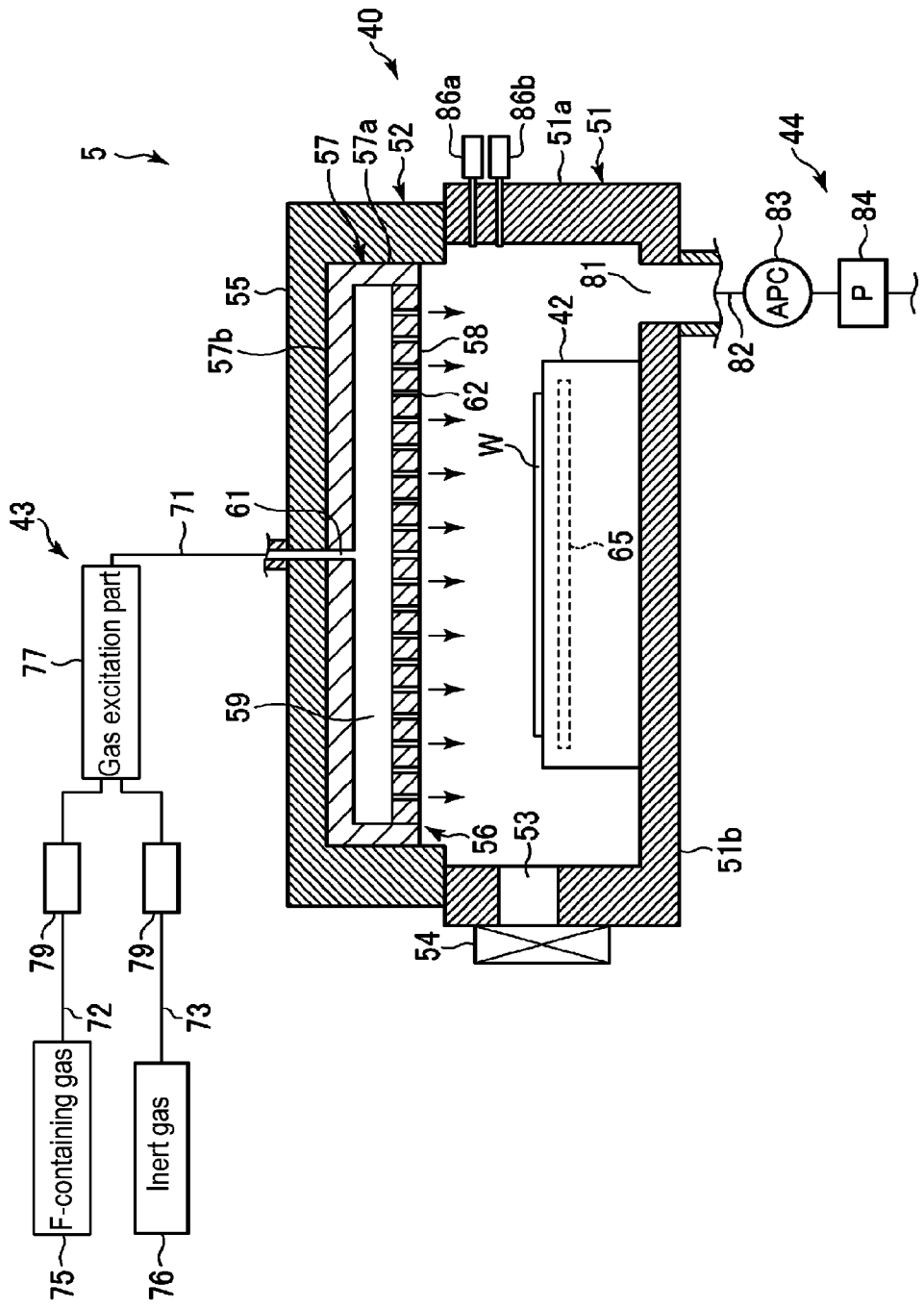
FIG. 3 is a sectional view illustrating an etching apparatus installed in the processing system of FIG. 1 and configured to perform the etching method according to an embodiment of the present disclosure.

Next, the etching apparatus 5 for carrying out the etching method of the present embodiment will be described in detail. FIG. 3 is a sectional view showing the etching apparatus 5. As shown in FIG. 3, the etching apparatus 5 includes a chamber 40 having a hermetically sealed structure. Inside the chamber 40, there is provided a mounting table 42 for mounting the wafer W thereon in a substantially horizontal posture. In addition, the etching apparatus 5 includes a gas supply mechanism 43 configured to supply an etching gas to the chamber 40, and an exhaust mechanism 44 configured to exhaust the interior of the chamber 40.

The chamber 40 is composed of a chamber body 51 and a lid 52. The chamber body 51 includes a substantially cylindrical sidewall portion 51a and a bottom portion 51b. An upper portion of the chamber body 51 is defined as an opening which is closed by the lid 52. The sidewall portion 51a and the lid 52 are hermetically sealed by a seal member (not shown), thus securing airtightness with respect to the interior of the chamber 40.

The lid 52 includes a lid member 55 constituting an outer shell, and a shower head 56 fitted inside the lid member 55 and provided so as to face the mounting table 42. The shower head 56 includes a main body 57 having a cylindrical sidewall 57a and an upper wall 57b, and a shower plate 58 provided at the bottom of the main body 57. A space 59 is formed between the main body 57 and the shower plate 58.

A gas introduction path 61 extending to the space 59 is formed in the lid member 55 and the upper wall 57b of the main body 57. A gas supply pipe 71 of the gas supply mechanism 43 is connected to the gas introduction path 61.

A plurality of gas discharge holes 62 is formed in the shower plate 58. The gas introduced into the space 59 via the gas supply pipe 71 and the gas introduction path 61 is discharged from the gas discharge holes 62 into an internal space of the chamber 40.

The sidewall portion 51a is provided with a loading/unloading port 53 through which the wafer W is loaded into or unloaded from the chamber 20 of the heat treatment apparatus 4. The loading/unloading port 53 can be opened and closed by the gate valve 54.

The mounting table 42 is substantially circular in plan view and is fixed to the bottom portion 51b of the chamber 40. A temperature regulator 65 for regulating a temperature of the mounting table 42 is provided inside the mounting table 42. The temperature regulator 65 is provided with a conduit through which, for example, a temperature regulating medium (e.g., water) circulates. Heat exchange is performed with the temperature regulating medium flowing through such a conduit, whereby the temperature of the mounting table 42 is adjusted so that the temperature of the wafer W mounted on the mounting table 42 is controlled.

The gas supply mechanism 43 includes a fluorine (F)-containing gas supply source 75 for supplying a fluorine-containing gas and an inert gas supply source 76 for supplying an inert gas. One end of an F-containing gas supply pipe 72 and one end of an inert gas supply pipe 73 are connected to the F-containing gas supply source 75 and the inert gas supply source 76, respectively. In each of the F-containing gas supply pipe 72 and the inert gas supply pipe 73, there is provided a flow rate controller 79 for performing an opening/closing operation of the respective pipe and a flow rate control operation. The flow rate controller 79 is composed of, for example, an opening/closing valve and a mass flow controller. The other end of the F-containing gas supply pipe 72 and the other end of the inert gas supply pipe 73 are connected to a gas excitation part 77 for exciting a gas. The gas supply pipe 71 described above is connected to the gas excitation part 77.

Accordingly, the fluorine-containing gas and the inert gas supplied from the F-containing gas supply source 75 and the inert gas supply source 76 to the gas excitation part 77 via the fluorine-containing gas supply pipe 72 and the inert gas supply pipe 73, respectively, are excited in the gas excitation part 77. The fluorine-containing gas and the inert gas thus excited are supplied into the shower head 56 via the gas supply pipe 71 and are discharged from the gas discharge holes 62 of the shower head 56 toward the wafer W inside the chamber 40.

The configuration of the gas excitation part 77 is not particularly limited as long as the gas excitation part 77 can excite the gas. For example, as shown in the figure, it is possible to use, among others, a remote plasma generator for generating plasma of the fluorine-containing gas and plasma of the inert gas by an appropriate method and guiding the generated plasma to the chamber 40. In some embodiments, plasma of the fluorine-containing gas and plasma of the inert gas may be generated inside the shower head 56 by other methods, and the generated plasma may be introduced into the chamber 40. In some embodiments, plasma may be generated inside the chamber 40 by other methods. In some embodiments, plasma may be directly generated inside the chamber 40 by using, for example, microwave plasma generated by introducing microwaves into the chamber 40, inductively coupled plasma, or capacitively coupled plasma represented by parallel plate type plasma.

Among these gases, the F-containing gas is a reaction gas, and the inert gas is a dilution gas. By supplying and plasmarizing these gases in a predetermined ratio, it is possible to obtain a desired etching performance.

As the F-containing gas, it may be possible to suitably use a hydrogen fluoride (HF) gas or a sulfur hexafluoride ($SF_6$). Of these, the HF gas is preferable. As the inert gas, it may be possible to suitably use an $N_2$ gas or an Ar gas. Other noble gases such as an He gas and the like may also be used.

The exhaust mechanism 44 includes an exhaust pipe 82 connected to an exhaust port 81 formed in the bottom portion 51*b* of the chamber 40. The exhaust mechanism 44 further includes an automatic pressure control valve (APC) 83 and configured to control an internal pressure of the chamber 40, and a vacuum pump 84 configured to exhaust the interior of the chamber 40, which are provided in the exhaust pipe 82.

In the sidewall of the chamber 40, two capacitance manometers 86*a* and 86*b* used as pressure gauges to measure the internal pressure of the chamber 40 are provided so as to be inserted into the chamber 40. The capacitance manometer 86*a* is used to measure high pressure while the capacitance manometer 86*b* is used to measure low pressure. A temperature sensor (not shown) for detecting a temperature of the wafer W is provided in the vicinity of the wafer W mounted on the mounting table 42.

Al is used as a material for various components such as the chamber 40, the mounting table 42 and the like that constitute the etching apparatus 5. The Al material constituting the chamber 40 may be a pure Al material or may have an anodized inner surface (an inner surface of the chamber body 51 or the like). On the other hand, the surface of Al constituting the mounting table 42 requires wear resistance. Therefore, an oxide film ($Al_2O_3$ film) having high wear resistance may be in some embodiments formed on the surface of the aluminum material by anodizing the Al material.

<Etching Method Using Etching Apparatus>

Next, an etching method using the etching apparatus configured as above will be described.

In this example, as the wafer W, a wafer having a silicon portion (a polysilicon film or the like) to be etched and having a SiN film and a $SiO_2$ film formed adjacent thereto is used.

The carrier C is mounted on the carrier mounting table 13 of the processing system 1 while accommodating such a wafer W. While opening the atmospheric-side gate valve 16, one sheet of wafer W is transferred from the carrier C of the loading/unloading part 2 to the load lock chamber 3 by one of the transfer arms 11*a* and 11*b* of the first wafer transfer mechanism 11, and is delivered to the pick of the second wafer transfer mechanism 17 in the load lock chamber 3.

Subsequently, the atmospheric-side gate valve 16 is closed and the interior of the load lock chamber 3 is evacuated. Then, the gate valves 22 and 54 are opened, and the pick is extended up to the etching apparatus 5 to mount the wafer W on the mounting table 42.

Thereafter, the pick is returned to the load lock chamber 3, the gate valve 54 is closed, and the interior of the chamber 40 is hermetically sealed. In this state, the temperature of the wafer W on the mounting table 42 is regulated to a predetermined target value by the temperature regulator 65. An F-containing gas and an inert gas are supplied from the F-containing gas supply source 75 and the inert gas supply source 76 of the gas supply mechanism 43 to the gas excitation part 77 via the F-containing gas supply pipe 72 and the inert gas supply pipe 73, respectively. These gases are excited in the gas excitation part 77. The F-containing gas and the inert gas thus excited are supplied into the shower head 56 via the gas supply pipe 71 and are discharged from the gas discharge holes 62 of the shower head 56 toward the wafer W inside the chamber 40. Thus, the silicon portion of the wafer W is etched.

In this case, the F-containing gas used as an etching gas is appropriately diluted with the inert gas. The F-containing gas and the inert gas are supplied to the wafer W in the excited state, whereby the silicon portion such as a polysilicon film or the like can be etched at a high etching rate and at a high selectivity with respect to the SiN film and the $SiO_2$ film. Specifically, the etching rate of the silicon portion such as a polysilicon film or the like may be set to 100 nm/min or more, and the etching selectivity of the SiN film and the $SiO_2$ film with respect to the silicon portion may be set to 300 or more.

As the F-containing gas, an HF gas or an $SF_6$ gas may suitably be used. By using these gases, it is possible to realize etching at a high etching rate and a high selectivity so that the etching rate of the silicon portion is 120 nm/min or more and the selectivity of the SiN film and the $SiO_2$ film to the silicon portion is 500 or more.

In particular, when a titanium-based film such as a TiN film or the like further exists on a wafer W having a silicon portion (a polysilicon film or the like) to be etched and having a SiN film and a $SiO_2$ film formed adjacent thereto, it is required to have a high selectivity even for the Ti-based film. By using an HF gas as the F-containing gas, it is possible to obtain a high selectivity of 500 or more even for the Ti-based films such as a TiN film or the like. As the Ti-based film, in addition to the TiN film, it may be possible to use a Ti film, a TiON film, a TiCN film, or the like.

The internal pressure of the chamber in the etching process may fall within a range of 66.5 to 266 Pa (0.5 to 2 Torr). The temperature (≈wafer temperature) of the mounting table 42 may fall within a range of 20 to 60 degrees C., specifically around 30 degrees C. A volume ratio (flow rate ratio or partial pressure ratio) of the F-containing gas and the inert gas may fall within a range of 10:1 to 1:10, specifically a range of 5:1 to 1:1. For example, F containing gas: inert gas may be 3:1.

<Structural Example of Applied Device>

Figure 4A:
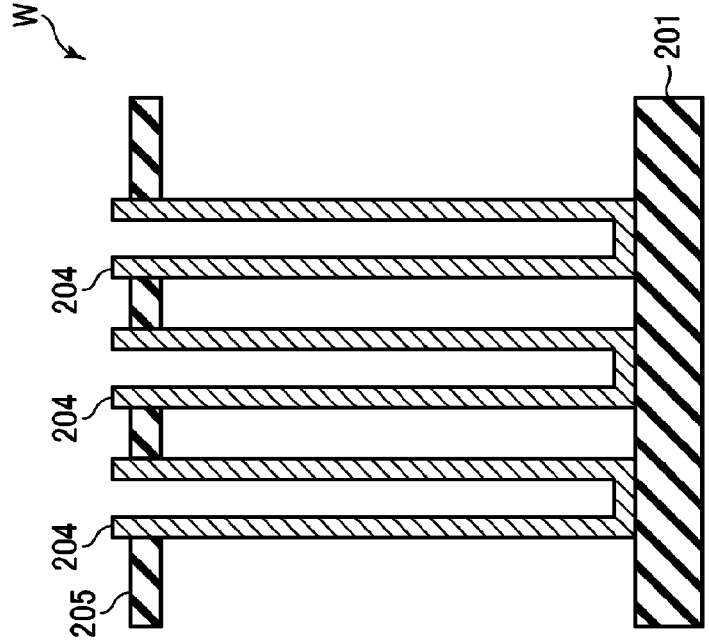
Figure 4B:
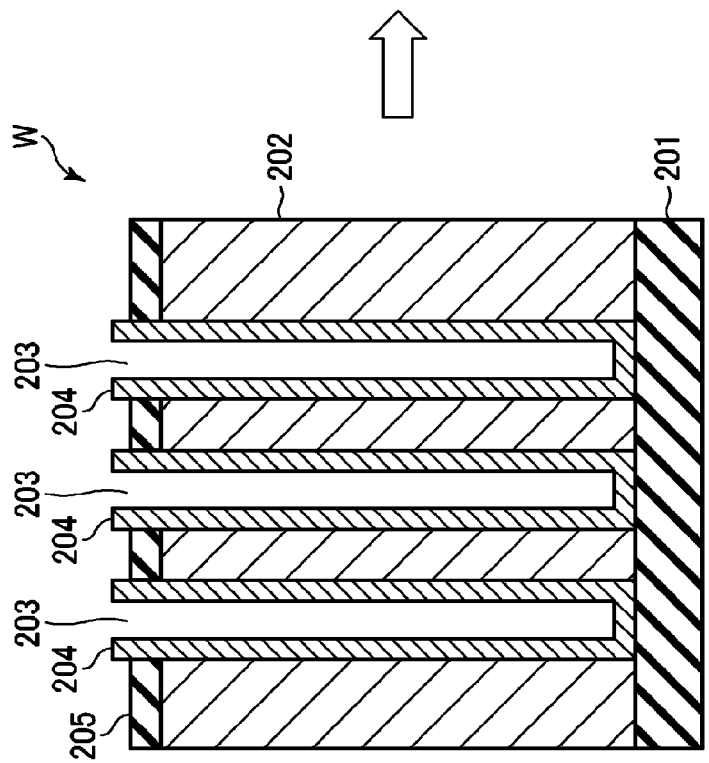

Next, a structural example of a device to which the present disclosure is applied will be described with reference to FIGS. 4A and 4B. In this example, the etching method is used for etching in a process of forming a TiN cylinder (lower electrode) of a DRAM capacitor. A wafer W was prepared which has a structure in which, as shown in FIG. 4A, an underlying $SiO_2$ film 201 is formed on a silicon substrate (not shown), a sacrificial polysilicon film 202 is formed on the $SiO_2$ film 201, a plurality of columnar recesses 203 having a high aspect ratio are formed in the sacrificial polysilicon film 202, cylindrical TiN films 204 serving as lower electrodes are formed in the respective recesses 203, and a SiN film 205 for supporting cylinders is formed on the sacrificial polysilicon film 202. The sacrificial polysilicon film 202 is etched away by the above etching method. Thus, as shown in FIG. 4B, the cylindrical TiN films 204 are left on the underlying $SiO_2$ film 201, and TiN cylinders (lower electrodes) of DRAM capacitors supported by the SiN film 205 are formed.

<Experimental Example>

Next, experiment examples will be described. A wafer having the structure shown in FIG. 4A was prepared. First, HF gas was used as the F-containing gas, $N_2$ gas was used as the inert gas. A polysilicon film was etched by plasmarizing the HF gas and the $N_2$ gas (in a first etching). In conditions applied at this time, the wafer temperature was 35 degrees C., the pressure was 133 Pa (1 Torr), a flow rate of the HF gas was 200 to 1,000 sccm, a flow rate of the $N_2$ gas was 50 to 500 sccm, and plasma generation power was 400 W. Subsequently, $SF_6$ gas was used as the F-containing gas, Ar gas was used as the inert gas. Etching was performed by plasmarizing the $SF_6$ gas and the Ar gas (in a second etching). In conditions applied at this time, the wafer temperature was 35 degrees C., the pressure was 66.6 Pa (0.5 Torr), a flow rate of the $SF_6$ gas was 50 to 300 sccm, a flow rate of the Ar gas was 500 to 1,000 sccm, and the plasma generation power was 400 W. For comparison, $F_2$ gas and $NH_3$ gas were used as the etching gases, and etching was performed without plasmarizing the $F_2$ gas and the $NH_3$ gas (in a third etching). In conditions applied at this time, the wafer temperature was 90 degrees C., the pressure was 573.3 Pa (4.3 Torr), a flow rate of the $F_2$ gas was 500 to 1,500 sccm, and a flow rate of the $NH_3$ gas was 5 to 30 sccm.

Figure 5:
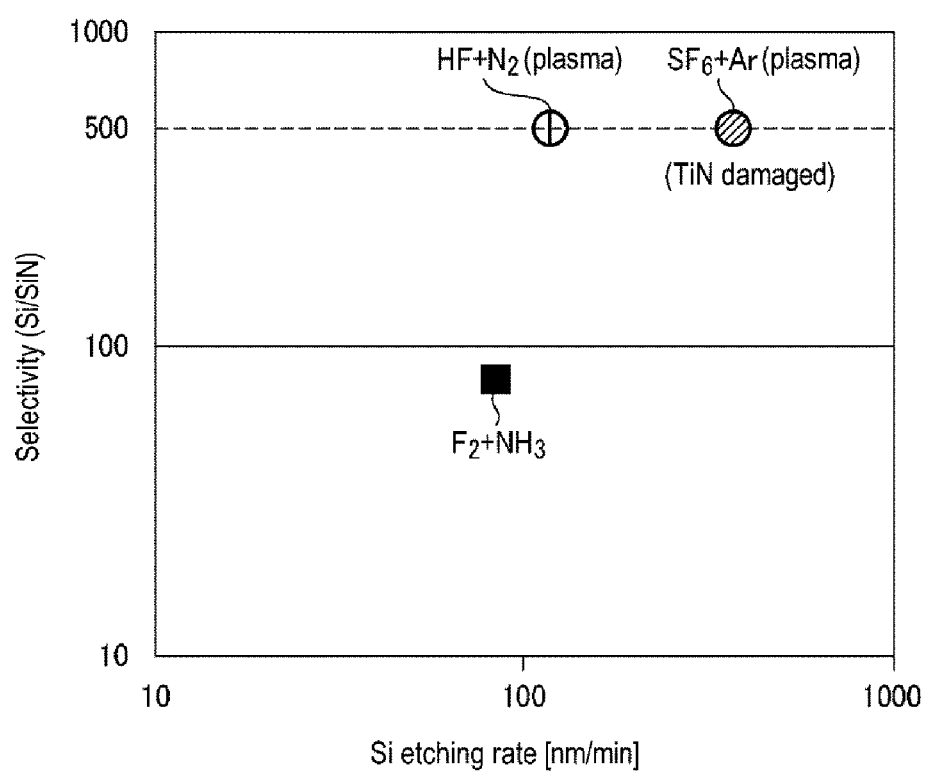
FIG. 5 is a diagram illustrating a relationship between an etching rate of a silicon portion and a selectivity (Si/SiN) in an experimental example.

Even in any of these etching processes, the selectivity of the polysilicon film to the $SiO_2$ film was at a high level of 500 or more. In addition, the relationship between the etching rate of the polysilicon film and the selectivity (Si/SiN) of the Si film to the SiN film in these etching processes is as shown in FIG. 5. That is to say, in the case of "the third etching" as a conventional example in which etching was performed using the $F_2$ gas and the $NH_3$ gas without plasmarizing them, the etching of the SiN film resulted in a selectivity (Si/SiN) of 80 which leads to inadequate results. This is presumably because reaction products generated when etching the polysilicon etch the SiN film. Furthermore, the etching rate was less than 100 nm/min and was still insufficient. On the other hand, in "the first etching" using the plasma of the HF gas and the $N_2$ gas and "the second etching" using the plasma of the $SF_6$ gas and the Ar gas, the selectivity (Si/SiN) was 500 and the etching rate of the polysilicon film was 120 nm/min or more, which satisfies the requirements of selectivity (Si/SiN) of 500 and the etching rate of 100 nm/min or more.

On the other hand, in the case of "the first etching" using the plasma of the HF gas and the $N_2$ gas, the TiN film was not damaged even when over-etching the polysilicon film. However, in the case of "the second etching" using the plasma of the $SF_6$ gas and the Ar gas, slight damage was generated in the upper portion of the TiN film when over-etching the polysilicon film. From this result, it was confirmed that "the first etching" using the plasma of the HF gas and the $N_2$ gas is preferable when the etching selectivity to the TiN film is also taken into consideration.

<Other Applications>

While the embodiment of the present disclosure has been described above, the present disclosure is not limited to the above-described embodiment. Various modifications may be made without departing from the spirit thereof.

For example, the apparatus of the above-described embodiment is nothing more than an example. The etching method of the present disclosure may be carried out by various apparatuses.

In addition, although there has been shown a case where the semiconductor wafer is used as the target substrate, the substrate is not limited to the semiconductor wafer but may be other substrates such as an FPD (flat panel display) substrate represented by a substrate for LCD (liquid crystal display), a ceramic substrate, and the like.

Furthermore, in the above-described embodiment, the etching of the sacrificial polysilicon of the DRAM capacitor has been described as an application example. However, the present disclosure is not limited thereto and may be applied to other uses such as polysilicon removal in a logic fin-FET process, Si resizing, and the like.

Furthermore, although a polysilicon film has been exemplified as a silicon portion of an object to be processed, the present disclosure is not limited thereto but may be applied to other silicon portions such as a silicon substrate, an epitaxially grown silicon crystal, and the like.

EXPLANATION OF REFERENCE NUMERALS

1: processing system, 2: loading/unloading part, 3: load lock chamber, 4: heat treatment apparatus, 5: etching apparatus, 6: control part, 11: first wafer transfer mechanism, 17: second wafer transfer mechanism, 40: chamber, 42: mounting table, 43: gas supply mechanism, 44: exhaust mechanism, 56: shower head, 71: gas supply pipe, 72: F-containing gas supply pipe, 73: inert gas supply pipe, 75: F-containing gas supply source, 76: inert gas supply source, 77: gas excitation part, W: semiconductor wafer

What is claimed is:

1. An etching method, comprising:
   preparing a target substrate including a silicon portion, a Ti-based film, a silicon nitride film formed on a surface of the silicon portion to support the Ti-based film, and a silicon oxide film; and
   selectively etching the silicon portion with respect to the Ti-based film, the silicon nitride film, and the silicon oxide film by supplying a fluorine-containing gas and an inert gas maintained in an excited state to the target substrate so that the Ti-based film is allowed to remain while being supported by the silicon nitride film,
   wherein the inert gas is a gas selected from a group consisting of an $N_2$ gas and noble gases.

2. The method of claim 1, wherein an etching rate for the silicon portion is 100 nm/min or greater, and an etching selectivity of the silicon portion to the silicon nitride film and the silicon oxide film is 300 or greater.

3. The method of claim 1, wherein the fluorine-containing gas is at least one selected from a group consisting of a hydrogen fluoride gas and a sulfur hexafluoride gas.

4. The method of claim 1, wherein the fluorine-containing gas is a hydrogen fluoride gas.

5. The method of claim 1, wherein the inert gas is at least one selected from a group consisting of the $N_2$ gas and an Ar gas.

6. The method of claim 1, wherein a volume ratio of the fluorine-containing gas and the inert gas is in a range of 10:1 to 1:10.

7. The method of claim 1, wherein a temperature of the target substrate at the time of etching is in a range of 20 to 60 degrees C.

8. The method of claim 1, wherein a pressure at the time of etching is in a range of 66.5 to 266 Pa.

9. A method for manufacturing a DRAM capacitor, comprising:
   preparing a semiconductor wafer having a structure in which an underlying silicon oxide film is formed on a semiconductor substrate, a sacrificial polysilicon film is formed on the silicon oxide film, a plurality of columnar recesses is formed in the sacrificial polysilicon film, a plurality of cylindrical TiN films serving as lower electrodes are formed in the respective columnar recesses and a silicon nitride film for supporting the cylindrical TiN films is formed on the sacrificial polysilicon film; and
   selectively etching the sacrificial polysilicon film by supplying a hydrogen fluoride gas and an inert gas which are maintained in an excited state to the semiconductor wafer so that the plurality of cylindrical TiN films are allowed to remain as the lower electrodes for DRAM capacitors supported by the silicon nitride film, wherein the inert gas is a gas selected from a group consisting of an $N_2$ gas and noble gases.

10. The method of claim 9, wherein an etching rate for the sacrificial polysilicon film is 100 nm/min or greater, and an etching selectivity of the sacrificial polysilicon film to the silicon nitride film and the silicon oxide film is 300 or greater.

11. The method of claim 9, wherein, in selectively etching the sacrificial polysilicon film, a sulfur hexafluoride gas maintained in an excited state is further supplied to the semiconductor wafer.

12. The method of claim 9, wherein the inert gas is at least one selected from a group consisting of the $N_2$ gas and an Ar gas.

13. The method of claim 9, wherein a volume ratio of the hydrogen fluoride gas and the inert gas is in a range of 10:1 to 1:10.

14. The method of claim 9, wherein a temperature of the semiconductor wafer at the time of etching is in a range of 20 to 60 degrees C.

15. The method of claim 9, wherein a pressure at the time of etching is in a range of 66.5 to 266 Pa.

* * * * *